(12) United States Patent
Bayle

(10) Patent No.: US 9,704,579 B1
(45) Date of Patent: Jul. 11, 2017

(54) NON-VALATILE SEMICONDUCTOR MEMORY DEVICE AND LOCATION BASED ERASURE METHODS

(71) Applicant: Powerchip Technology Corporation, Hsinchu (TW)

(72) Inventor: Mathias Bayle, Tokyo (JP)

(73) Assignee: Powerchip Technology Corporation, Hsinchu (TW)

( * ) Notice: Subject to any disclaimer, the term of this patent is extended or adjusted under 35 U.S.C. 154(b) by 0 days.

(21) Appl. No.: 15/219,295

(22) Filed: Jul. 26, 2016

(30) Foreign Application Priority Data

Mar. 24, 2016 (JP) .................................. 2016-060570

(51) Int. Cl.
| | | |
|---|---|---|
| *G11C 16/04* | (2006.01) | |
| *G11C 16/16* | (2006.01) | |
| *G11C 16/34* | (2006.01) | |
| *G11C 16/28* | (2006.01) | |
| *G11C 16/10* | (2006.01) | |
| *G11C 16/14* | (2006.01) | |

(52) U.S. Cl.
CPC .......... *G11C 16/0483* (2013.01); *G11C 16/10* (2013.01); *G11C 16/14* (2013.01); *G11C 16/16* (2013.01); *G11C 16/28* (2013.01); *G11C 16/3445* (2013.01)

(58) Field of Classification Search
CPC ..... G11C 16/3445; G11C 16/14; G11C 16/10; G11C 16/28; G11C 16/16; G06F 12/0246
See application file for complete search history.

(56) References Cited

U.S. PATENT DOCUMENTS

| | | | |
|---|---|---|---|
| 7,952,927 B2 | 5/2011 | Aritome | |
| 2008/0165585 A1 | 7/2008 | Surico et al. | |
| 2008/0205163 A1* | 8/2008 | Park .................... | G11C 11/5621 365/185.23 |
| 2011/0066872 A1* | 3/2011 | Miller ..................... | G06F 1/30 713/340 |
| 2011/0069543 A1 | 3/2011 | Lee et al. | |
| 2012/0008412 A1* | 1/2012 | Park ...................... | G11C 16/14 365/185.22 |

(Continued)

FOREIGN PATENT DOCUMENTS

JP      2007250186      9/2007

OTHER PUBLICATIONS

"Office Action of Taiwan Counterpart Application", issued on Mar. 22, 2017, p. 1-p. 6, in which the listed references were cited.

*Primary Examiner* — Harry W Byrne
*Assistant Examiner* — Ajay Ojha
(74) *Attorney, Agent, or Firm* — Jianq Chyun IP Office

(57) ABSTRACT

A non-volatile semiconductor memory device comprising a control circuit is provided, the control circuit performing a data erasure by applying predetermined erase voltages to predetermined blocks of a memory cell array including memory cells disposed on each intersection of a plurality of word lines and a plurality of bit lines, and the control circuit applying the erase voltages to the memory cells to erase data by applying word line voltages different to each other to even-numbered word lines and odd-numbered word lines of the memory cell array except to an edge part thereof, and by applying a voltage different to the word line voltages to the word line in the edge part of the memory cell array.

7 Claims, 8 Drawing Sheets

(56) References Cited

U.S. PATENT DOCUMENTS

| | | | |
|---|---|---|---|
| 2013/0163359 A1* | 6/2013 | Noh | G11C 11/5635 |
| | | | 365/203 |
| 2013/0242667 A1* | 9/2013 | Shim | G11C 16/0483 |
| | | | 365/185.19 |
| 2014/0119121 A1 | 5/2014 | Aritome | |
| 2014/0208044 A1 | 7/2014 | Kim | |
| 2014/0269090 A1 | 9/2014 | Flynn et al. | |

* cited by examiner

NON-VALATILE SEMICONDUCTOR MEMORY DEVICE AND LOCATION BASED ERASURE METHODS

CROSS-REFERENCE TO RELATED APPLICATION

This application claims the priority benefit of Japan application serial no. 2016-060570, filed on Mar. 24, 2016. The entirety of the above-mentioned patent application is hereby incorporated by reference herein and made a part of this specification.

BACKGROUND OF THE INVENTION

Field of the Invention

The present invention relates to a non-volatile memory device such as a flash memory and an erasure method thereof.

Description of Related Art

In the recent non-volatile memory device such as a flash memory, adopting a double patterning technology in order to attain large scale and high density semiconductor microlithography. The double patterning technology is applied to microlithography technology with resolution smaller than 42 nm, a known method exposing a pattern with 2 times of its pitch then exposing it with an offset of merely half of its pitch, and a plurality of methods such as removing unnecessary patterns after applying a process trick such as a spacer process.

PRIOR ART REFERENCE

Patent Reference

[Patent reference 1] JP 2007-250186
[Patent reference 2] US 2008/0165585
[Patent reference 3] US 2013/0163359
[Patent reference 4] US 2011/0069543
[Patent reference 5] US 2012/0008412

Problems to be Solved by the Present Invention

As a result of the aforementioned large scale and high density flash memory, the space between each word line and the space between each bit line become very narrow, so that the properties of data programming (writing) or erasing between adjacent word lines or adjacent bit lines are largely affected. Therefore, for example, in the prior art such as in the patent reference 1 to patent reference 5, methods for optimizing data erasure properties are provided.

FIG. 1 is a cross-section view illustrating the applied voltages to each electrode during data erasure of a flash memory in a prior art example.

In FIG. 1, forming a N well 2 by implanting, such as, phosphorous on a P type semiconductor substrate, forming a P well 3 by implanting, such as, boron on an upper part of the N well 2. Then, by forming following electrodes on the P well 3, to apply predetermined voltages (the voltages in each pair of parentheses in FIG. 1) to each electrodes N well 2 and P well 3 in order to perform data erasure as shown in FIG. 1. Moreover, FL is in a state of floating.
(1) Source line SL;
(2) Selection gate line SGS, selection gate line SGD;
(3) Dummy word line DWLS, dummy word line DWLD;
(4) Word line WL0 to word line WL31;
(5) Bit line GBL.

Herein, VDWL is the voltage applied to dummy word line DWLS and dummy word line DWLD. Applying voltage Vea, voltage Veb, voltage Veb and voltage Vea respectively to edge region side word line WL0, edge region side word line WL1, edge region side word line WL30 and edge region side word line WL31 of two edge regions individually adjacent to each of the dummy word line DWLS and dummy word line DWLD. In addition, applying voltage Vee to from word line WL2 to word line WL29 in a central part outside of the edge regions, and applying voltage VERS to N well 2 and P well 3. Those voltages applied are described in an example as follows.

$Vea = Veb \approx 0$ V $Vee = 0.3$ V~$0.5$ V $VERS = 15$ V~$25$ V

According to the erasure method of the prior art example in FIG. 1, the edge regions are not periodic during manufacturing process, so that they are abnormal regions. In general, the word lines in the edge regions erasing at a slower erasure speed than that of the other regions. Thus, it is usual to apply 0 V to the word lines in the edge regions. On the other hand, applying voltage larger than 0 V to the word lines outside of the edge regions. Performing adjustment to decrease the erasure speed of the word lines having higher erasure speed by such method, so that the erasure speed of all of the word lines is uniform. Thus, the distribution of the threshold values of the memory cells after erasure is narrowed. However, in the double patterning technology, a uniform line width or line space of the word lines in a central part cannot be guaranteed. Therefore, a problem arises where, the erasure operation of the word lines outside of the edge regions cannot be optimized.

SUMMARY OF THE INVENTION

In contrast to the prior art, the present invention aims to provide a non-volatile semiconductor memory device and an erasure method thereof that are able to optimize an erasure operation of the non-volatile semiconductor memory device.

Methods to Solve the Problem

A non-volatile semiconductor memory device of a first invention comprises a control circuit, the control circuit performing a data erasure by applying predetermined erase voltages to predetermined regions of a memory cell array including memory cells disposed on each intersection of a plurality of word lines and a plurality of bit lines, and the non-volatile semiconductor memory device is characterized in:

The control circuit applying the erase voltages to the memory cells to erase data by applying word line voltages different to each other to even-numbered word lines and odd-numbered word lines of the memory cell array except to an edge part thereof, and by applying a voltage different to the word lines in the edge part of the memory cell array.

In the non-volatile semiconductor memory device, it is characterized in: the word line voltage applied to the odd-numbered word lines of the memory cell array except to the edge part thereof is set higher or lower than the word line voltage applied to the even-numbered word lines of the memory cell array except to the edge part thereof.

In addition, in the non-volatile semiconductor memory device, it is characterized in: the word lines of the edge part of the memory cell array is at least one word line adjacent to a selection gate line or a dummy word line at both sides.

Besides, in the non-volatile semiconductor memory device, it is characterized in: the control circuit performing a verification of the data erasure in different verify conditions to the memory cells of even-numbered bit lines and the memory cells of odd-numbered bit lines.

Moreover, in the non-volatile semiconductor memory device, it is characterized in: the verify conditions to the memory cells of the even-numbered bit lines and the memory cells of the odd-numbered bit lines are set different as at least one of the following conditions:
(1) The word line voltages;
(2) A discharging time of the bit lines those perform pre-charging to the bit lines to read data during data reading;
(3) A charging time of the bit lines when charging from source lines to perform data reading opposite to the above mentioned data reading;
(4) A pre-charging time of the bit lines those perform pre-charging to the bit lines to read data during data reading; and
(5) A sense voltage of the bit lines that perforin pre-charging to the bit lines to read data during data reading.

In addition, in the non-volatile semiconductor memory device, it is characterized in: the word line voltages different to each other are determined based on threshold value voltages measured while data erasure in a wafer test of the non-volatile semiconductor memory device.

Besides, in the non-volatile semiconductor memory device, it is characterized in: the word line voltages different to each other are determined based on the erase voltages give the same threshold value voltage measured while data erasure in a wafer test of the non-volatile semiconductor memory device.

Moreover, in the non-volatile semiconductor memory device, it is characterized in: the threshold value voltages measured while data erasure in the wafer test is measured as the four following cases:
(1) A case of the even-numbered word lines and the even-numbered bit lines;
(2) A case of the even-numbered word lines and the odd-numbered bit lines;
(3) A case of the odd-numbered word lines and the even-numbered bit lines; and
(4) A case of the odd-numbered word lines and the odd-numbered bit lines.

In addition, in the non-volatile semiconductor memory device, it is characterized in: the erase voltages are applied to wells of the memory cell array.

Besides, in the non-volatile semiconductor memory device, it is characterized in: the determined word line voltages data different to each other are stored to a partial region of the memory cell array, read from the memory cell array when the non-volatile semiconductor memory device is turned on and applied during the data erasure.

Besides, in the non-volatile semiconductor memory device, it is characterized in: performing writing to all of the memory cells of the determined region, before performing a sequence of the erasure.

An erasure method of a non-volatile semiconductor memory device of a second invention is the following erasure method of a non-volatile semiconductor memory device, the non-volatile semiconductor memory device comprises a control circuit, the control circuit performing a data erasure by applying predetermined erase voltages to predetermined regions of a memory cell array including memory cells disposed on each intersection of a plurality of word lines and a plurality of bit lines, the erasure method of the non-volatile semiconductor memory device is characterized in:

The control circuit applying the erase voltages to the memory cells to erase data by applying word line voltages different to each other to even-numbered word lines and odd-numbered word lines of the memory cell array except to an edge part thereof, and by applying a voltage different to the word line voltages to the word lines in the edge part of the memory cell array.

In the erasure method of the non-volatile semiconductor memory device, it is characterized in: the word line voltage applied to the odd-numbered word lines of the memory cell array except to the edge part thereof is set higher or lower than the word line voltage applied to the even-numbered word lines of the memory cell array except to the edge part thereof.

Effect of the Present Invention

As a result, in contrast to the prior art, a non-volatile semiconductor memory device and an erasure method thereof that are able to optimize an erasure operation of the non-volatile semiconductor memory device can be provided.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 8 is a process flow diagram applied when the flash memory of FIG. 4 is turned on.

DESCRIPTION OF THE EMBODIMENTS

Hereafter, description of embodiments of the present invention will be made referring to the accompanying drawings. Moreover, the same reference numbers are used in each embodiment to refer to the same configuration elements.

The understanding of the present invention is obtained by measuring.

Figure 2:
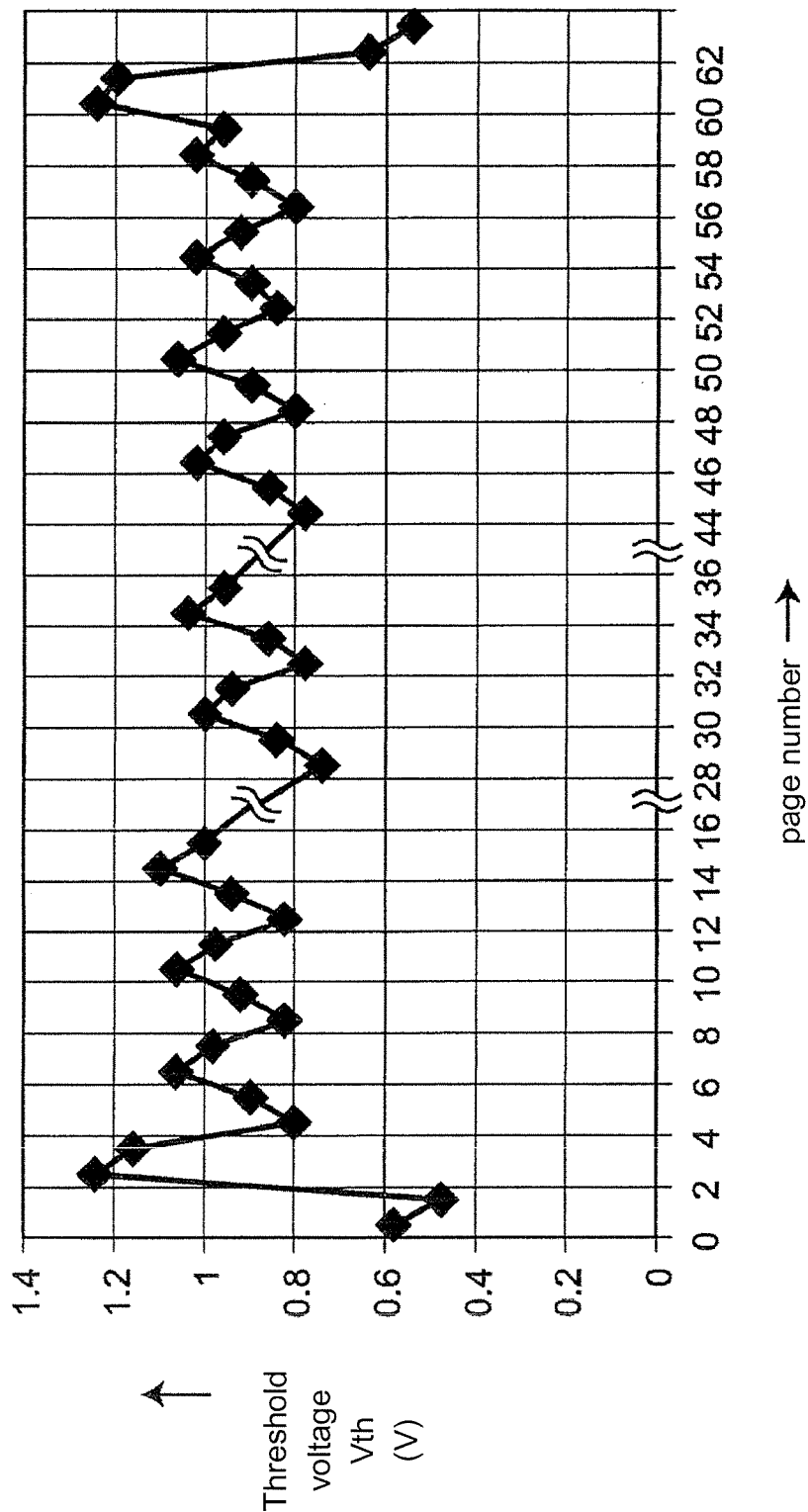
FIG. 2 is a curve diagram illustrating the erasure characteristics, which are the threshold value voltages (Vth) in correspondence to page numbers, of the flash memory via double patterning.
Figure 3:
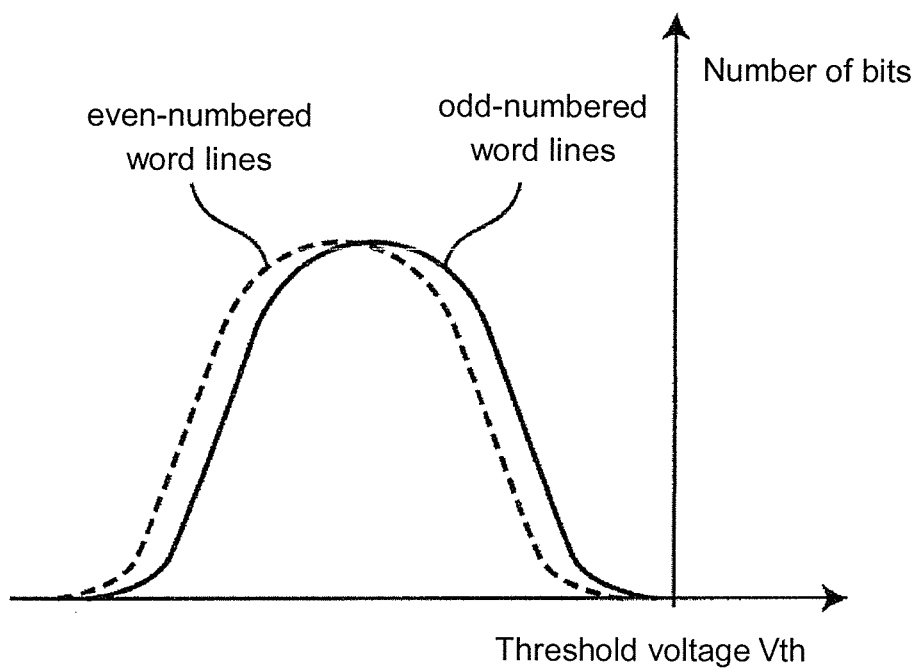
FIG. 3 is a distribution curve diagram illustrating the erasure characteristics, which are the threshold values in correspondence to the memory cells of the odd-numbered word lines and the even-numbered word lines, of the flash memory via double patterning.

FIG. 2 is a graph diagram illustrating the measure results, which are the threshold value voltages (Vth) in correspondence to page numbers, of the NAND type flash memory of the present invention. In addition, FIG. 3 is a curve diagram illustrating the measure result, which is the distribution of the threshold values in correspondence to the memory cells of the odd-numbered word lines and the even-numbered word lines, of the NAND type flash memory of the present invention.

In FIG. 2, memory cells of page P0 and page P1 of the NAND type flash memory are located on an even-numbered word line WL0, memory cells of page P2 and page P3 are located on an odd-numbered word line WL1. Also, page P0, page P2, page P4, etc. are located on even-numbered bit lines GBL, page P1, page P3, page P5, etc. are located on odd-numbered bit lines GBL. In other words, the relationship of page numbers, numbers of word lines and numbers of bit lines is as follows.

TABLE 1

| Page | Word lines | Bit lines |
|------|------------|-----------|
| P0 | WL0 | even-numbered |
| P1 | WL0 | odd-numbered |
| P2 | WL1 | even-numbered |
| P3 | WL1 | odd-numbered |
| P4 | WL2 | even-numbered |
| P5 | WL2 | odd-numbered |
| ... | ... | ... |

As the illustration by the diagrams of FIG. 2 and FIG. 3, the following information can be realized.

(1) In correspondence to the even-numbered word lines or the odd-numbered word lines, the threshold value voltages Vth are approximately the same value, but with slight difference because of the variation on manufacturing of semiconductor chips.

(2) For bit lines GBL, in correspondence to the even-numbered bit lines or the odd-numbered bit lines being adjacent to each other, the threshold value voltages Vth vary periodically.

(3) In correspondence to page numbers, the threshold value voltages Vth vary periodically.

Based on the understanding, the present invention provides an erasure method of the present embodiment as follows.

Figure 4:
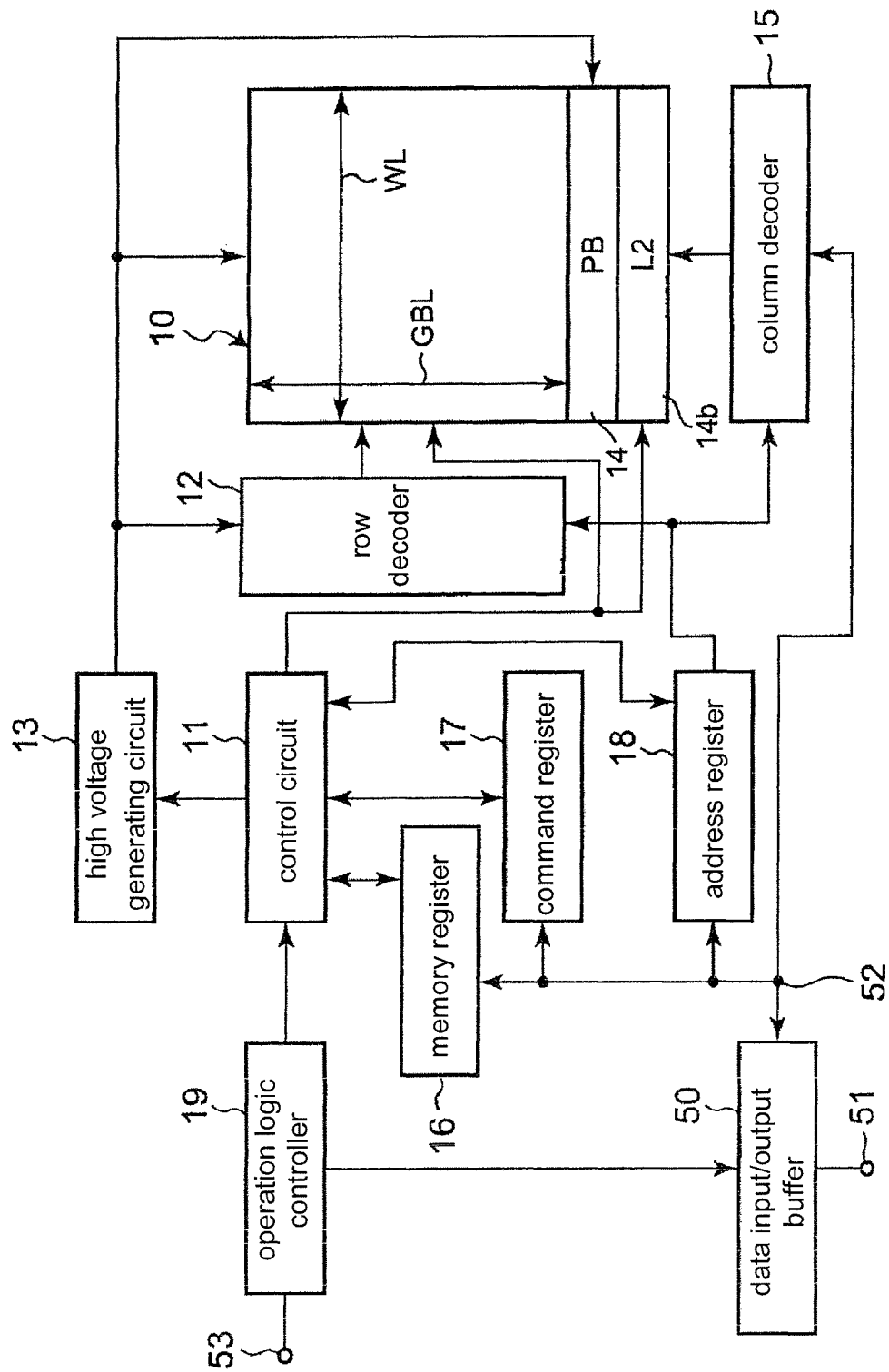
FIG. 4 is a block diagram illustrating a configurational example of the flash memory of an embodiment of the present invention.

FIG. 4 is a block diagram illustrating a configurational example of the NAND type flash memory of an embodiment of the present invention. In FIG. 4, the configuration of the NAND type flash memory of the present embodiment comprises a memory cell array 10, a control circuit 11 controlling the memory cell array 10, a row decoder 12, a high voltage generating circuit 13, a page buffer circuit (PB) 14, a column decoder 15, a memory register 16, a command register 17, an address register 18, an operation logic controller 19, a data input/output buffer 50, a data input/output terminal 51 and a control signal input terminal 53. Moreover, 52 is a data line.

The page buffer circuit 14 comprises a sense amplifier circuit and a data latch circuit disposed for each set (GBLe and GBLo) of the bit lines GBL, in order to perform data writing and reading of the determined page unit. Moreover, the page buffer circuit 14 comprises a latch circuit (L2).

Each memory cell string of the memory cell array 10 is connected to each intersection of selection gate lines SGD and the bit lines GBL. Each memory cell of the memory cell strings MC is connected to a plurality of word lines WL. In order to perform selection of the word lines WL and the bit lines GBL of the memory cell array 10, the row decoder 12 and the column decoder 15 are disposed respectively. The control circuit 11 performs sequence control of data writing, erasing and reading. The memory register 16 is connected to the control circuit 11. The memory register 16 pre-stores parameters (mode set data) required for the operations of reading, writing and erasing. The memory register 16 is set by the control circuit 11 through reading from a fuse data storage region in the memory cell array when it is turned on. The high voltage generating circuit 13 controlled by the control circuit 11 generates high voltage or medium voltage being boosted and applied for data rewriting, erasing and reading.

The data input/output buffer 50 is applied for data input, data output and input of command and address signal. In other words, performing data transmission between the input/output terminal 51 and page buffer circuit 14 through the input/output buffer 50, the data line 52 and the latch circuit (L2) 14b. The address signal input from the input/output terminal 51 is kept in the address register 18, and is sent to the row decoder 12 and the column decoder 15 for decoding. The command of operation control is also input from the input/output terminal 51. The input command is decoded and kept in the command register 17, in order to control the control circuit 11. Acquiring an external control signal such as a chip enable (CEB) signal, a command latch enable (CLE) signal, an address latch enable (ALE) signal, a writing enable (WEB) signal, a reading enable (REB) signal, etc. through the control signal input terminal 53 to the operation logic controller 19, and generating an internal control signal according to operation modes. The internal control signal is applied for controlling such as data latching, transmitting, etc. in the input/output buffer 50, and it is sent to the control circuit 11, further to perform operation controlling.

Figure 1:
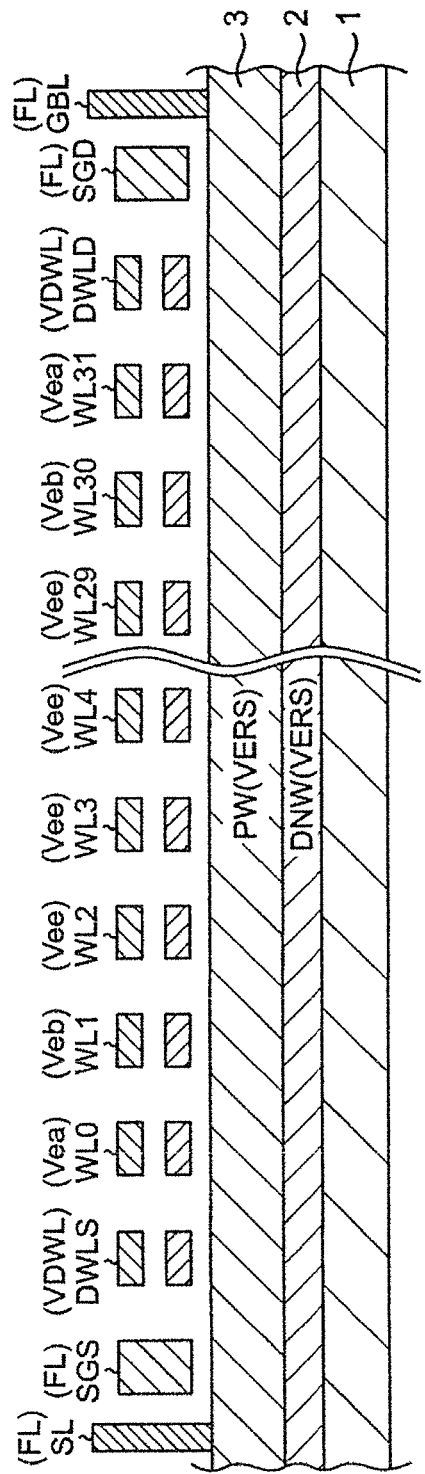
FIG. 1 is a cross-section view illustrating the applied voltages to each electrode during data erasure of a flash memory in a prior art example.
Figure 5:
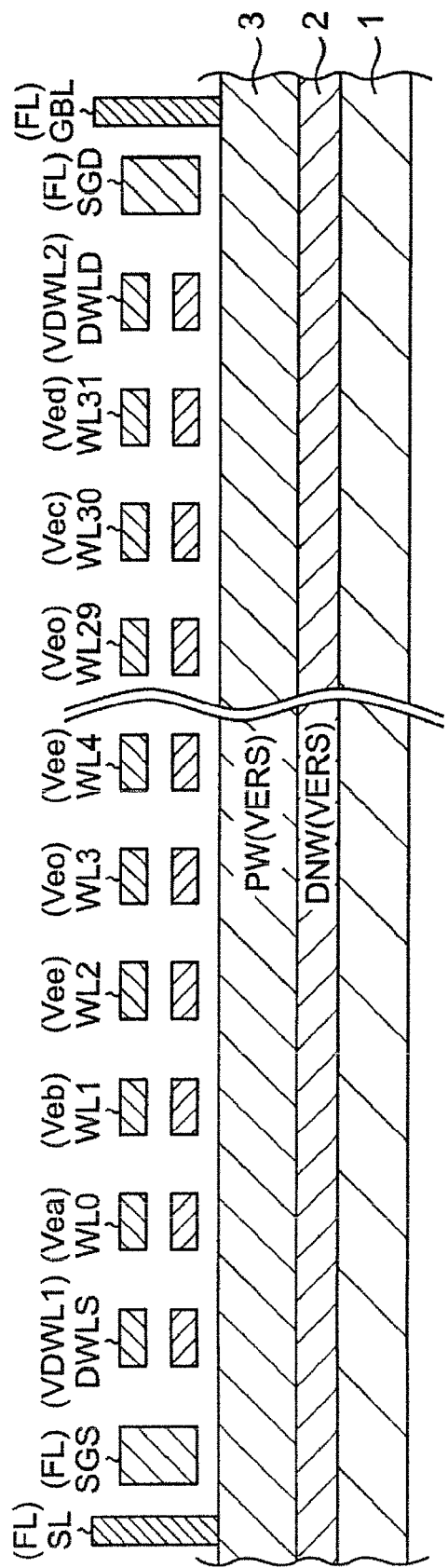
FIG. 5 is a cross-section view illustrating the applied voltages to each electrode during data erasure of the flash memory of FIG. 4.

FIG. 5 is a cross-section view illustrating the applied voltages to each electrode during data erasure of the flash memory of FIG. 4. In FIG. 5, the P type semiconductor substrate 1, the N well 2, the P well 3 and each electrode are formed in the same way as FIG. 1, however, they differ in the following manner.

(1) Applying voltage VDWL1 to the dummy word line DWLS to replace voltage VDWL.
(2) Applying voltage VDWL2 to the dummy word line DWLD to replace voltage VDWL.
(3) Applying voltage Vea and voltage Veb to the word line WL0 and the word line WL1 in the edge region, applying voltage Vec and voltage Ved to the word line WL30 and the word line WL31 in the edge region.
(4) Applying voltage Vee to the even-numbered word line WL2, the word line WL4, . . . and the word line WL28 outside of the edge region.
(5) Applying voltage Veo to the odd-numbered word line WL1, the word line WL3, . . . and the word line WL29 outside of the edge region.

Herein, the applied voltages are described in an example as follows.

$Vea=Ved=0$ V~0.5 V $Veb=Vec=0$ V~0.5 V $Vee=0.3$ V~0.5 V

Veo=0.3 V~0.5 V

VERS=15 V~25 V

Thus, according to the understanding of FIG. 2 and FIG. 3, preferably setting in a way that voltage Veo, which is applied to the odd-numbered word lines, is 0.1 V~0.5 V lower than voltage Vee, which is applied to the even-numbered word lines. In the prior art example in FIG. 1, voltage Vea is applied to two of the most edge word line WL0 and the word line WL31 in the edge region, voltage Vee is applied to the word lines outside of the edge region without a voltage difference between the even-numbered word lines and the odd-numbered word lines. Whereas, in the present embodiment, considering the effect of the understanding of FIG. 2 and FIG. 3, it is characterized that voltage Vee and voltage Veo are applied with a voltage difference to the word lines in the central region outside of the edge region according to the word lines that are either even-numbered or odd-numbered.

In addition, in the present embodiment, respectively applying voltages different from voltage Vee and voltage Veo, which are applied to the central region, to each two of the word line WL0, the word line WL1, the word line WL30 and the word line WL31 in the two edge regions of an edge part of the memory cell array. Herein, it is configured with each two of the word line WL0, the word line WL1, the word line WL30 and the word line WL31 in the two edge regions of the edge part of the memory cell array, but the present invention is not limited thereto, it may also apply voltage different from voltage Vee and voltage Veo, which are applied to the central region, to one or three of the word line(s) at the two ends. A condition that 32 memory cells are connected on the memory cell string MC is disclosed in the present embodiment, but it is not limited thereto, it can also be 64 or more memory cells in series, while the edge regions becoming larger. Moreover, as shown in FIG. 5, the word line WL0 is disposed adjacent to the selection gate line SGS through the dummy word line DWLS, the word line WL31 is disposed adjacent to the selection gate line SGD through the dummy word line DWLD, in addition, the word lines in the edge part can also include the word line WL1 and the word line WL30 in addition to WL0 and WL31 as the present embodiment.

Figure 6:
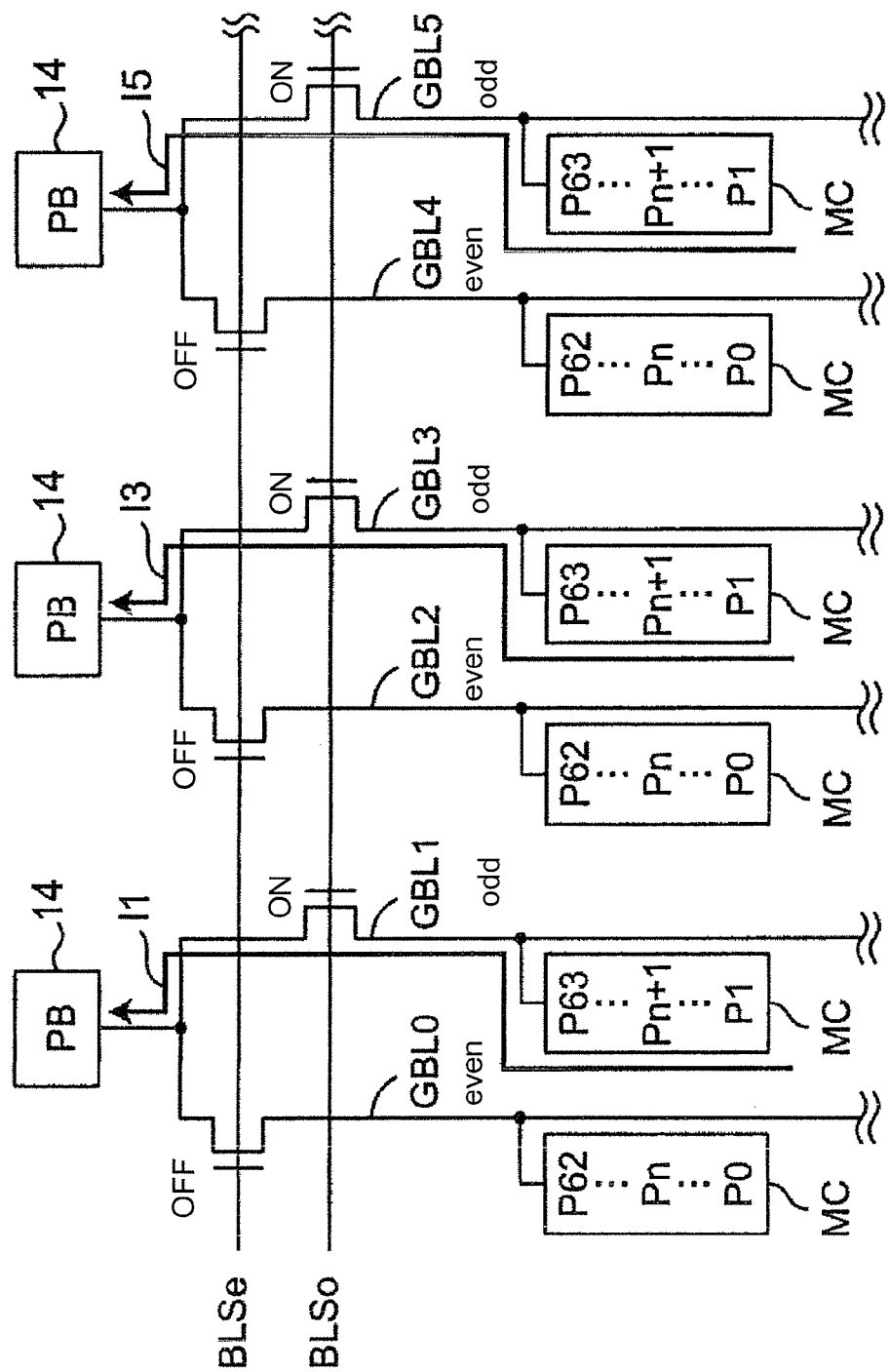
FIG. 6 is a circuit diagram illustrating the verify operation during data erasure of the flash memory of FIG. 4.

FIG. 6 is a circuit diagram illustrating the verify operation during data erasure sequence of the flash memory of FIG. 4. In FIG. 6, MC is the NAND type memory cell string, BLSe is the selection signal of the even-numbered bit line GBL0, the bit line GBL2, etc., BLSo is the selection signal of the odd-numbered bit line GBL1, the bit line GBL3, etc.

Herein, the width of the active layer region of the memory cell string MC and the width of the floating gates are, as described above, having a variation of the dependency on even numbers and odd numbers, and such variation will also affect the threshold value voltages Vth during erasure. Although the difference of the data of the graph diagram of FIG. 2 is slight, it largely depends on wafer and/or wafer lot of the flash memory chips. The difference cannot be compensated by the word line voltage VWL during erasure because the word line WL is shared. The difference can be compensated by changing the setting of verify conditions. For example, the word line voltage VWL is preferably changed between even-numbered pages and odd-numbered pages. Being another method, the difference can be substantially compensated by using the discharging time of the bit line GBL during general data reading (to ground the source line, and to read data by performing pre-charging to the bit lines from the page buffer circuit 14), or the charging time of the bit line GBL during reverse reading (to perform charging to the bit lines from the source line SL at GBL=0 V.) Besides, the difference can also be compensated by using the pre-charging time of the bit lines that perform pre-charging to the bit lines to read data during data reading, or using a sense voltage of the bit lines that perform pre-charging to the bit lines to read data during data reading.

In other words, in the present embodiment, the verify conditions during data erasure sequence can also be set as the following way, which is, setting the memory cells of the even-numbered bit lines and the memory cells of the odd-numbered bit lines different as at least one of the following conditions:

(1) The word line voltage VWL;
(2) A discharging time of the bit lines those perform pre-charging to the bit lines to read data during data reading;
(3) The charging time of the bit lines when performing charging from the source line to perform data reading during the reverse data reading;
(4) The pre-charging time of the bit lines those perform pre-charging to the bit lines to read data during data reading; and
(5) The sense voltage of the bit lines those perform pre-charging to the bit lines to read data during data reading.

FIG. 6 is illustrating the verification of the odd-numbered pages performed by the reverse reading, the verification during erasure (the confirmation when data is erased) is divided into two operations of the verification of the odd-numbered pages and the verification of the even-numbered pages. For example, setting some of the word line voltage VWL to 0 V in order to perform the verification of the even-numbered pages, and setting it to, such as, 0.2 V in order to perform the verification of the odd-numbered pages. That is, according to the characteristics of the graph diagram of FIG. 2, the reason is that the erasure of the odd-numbered pages is slower than the erasure of the even-numbered pages.

Figure 7:
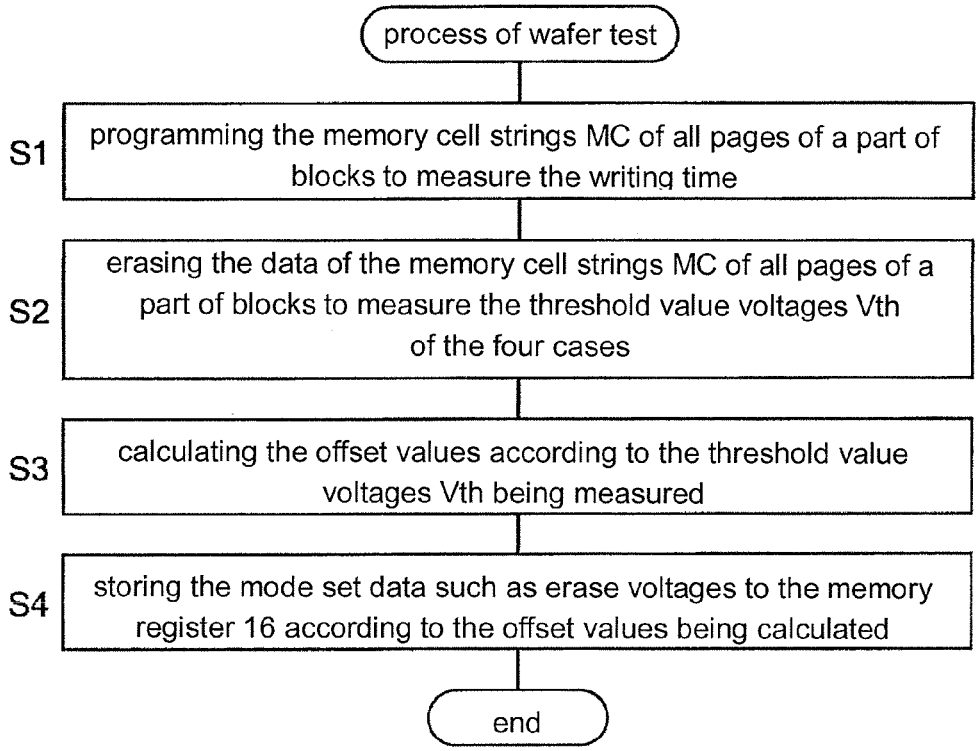
FIG. 7 is a process flow diagram illustrating the wafer test for the flash memory of FIG. 4.

FIG. 7 is a process flow diagram illustrating the wafer test for the flash memory of FIG. 4. Hereafter, describing an example of voltage setting referring to FIG. 7, while illustrating the wafer test process.

In the step S1 of FIG. 7, programming all of the memory cell strings MC with data ⌈0⌋ to measure the writing time. The present step is also used in the next step as the pre-process of measuring erasure characteristics, but the writing time is the parameters applied to determine the set conditions of writing, yet is nothing to do with the parameters of erasure.

Specifically, applying a method of incremental step pulse program (ISPP) to measure the following items of all of the pages of several blocks in the memory cell array 10, to calculate the starting voltage Vstart of writing in actual use. Herein, recording the word line voltage Vpn when the threshold value of first 10 bits of memory cells exceeds the verify voltage PV, the starting voltage Vstart is determined by an equation such as the starting voltage Vstart equals to the mean value of the voltages Vpn minus 2 V. Moreover, the mean value of the voltages Vpn of all pages is used in the present example, but the present invention is not limited thereto, the minimum value of the voltage Vpn of all pages can also be used.

In the step S2, erasing the data (Vth<0 V) of the memory cell strings MC of several blocks to measure the threshold value voltages Vth of the four cases of case A to case D. Herein, the four cases are as follows.

(Case A) The even-numbered word lines and the even-numbered bit lines.
(Case B) The even-numbered word lines and the odd-numbered bit lines.
(Case C) The odd-numbered word lines and the even-numbered bit lines.
(Case D) The odd-numbered word lines and the odd-numbered bit lines.

Specifically, measuring several blocks by the following items, using the mean value of them and calculating the offset value in actual use. Firstly, applying a method of incremental step pulse erase (ISPE), such as applying starting voltage as 14 V, step voltage as 0.2 V, erase verify voltage EV as 0 V to erase data, until the threshold value voltages Vth of 50% of the bits of page 32 (central WL line of the memory string) is equal to 0 V or lower. Then, measuring the threshold value voltages Vth of the bit having 10th-largest threshold value voltages Vth, for the four cases. The specific sequence is as follows.

(1) Reading the data of page 0, measuring the mean value of the 10th largest threshold value voltages Vth as Vth0. Herein, the data of several blocks of the page 0 can be acquired, so that an operation of acquiring the mean value is added. (It is the same as the following sequence)
(2) Reading the data of page 1, measuring the mean value of the 10th largest threshold value voltages Vth as Vth1.
(3) Reading the data of page 2, measuring the mean value of the 10th largest threshold value voltages Vth as Vth2.
(4) Reading the data of page 3, measuring the mean value of the 10th largest threshold value voltages Vth as Vth3.
(5) Reading the data of page 4, page 8, page 12, . . . and page 56, measuring the mean value of the 10th largest threshold value voltages Vth as the threshold value voltage Vthee of case A.
(6) Reading the data of page 5, page 9, page 13, . . . and page 57, measuring the mean value of the 10th largest threshold value voltages Vth as the threshold value voltage Vtheo of case B.
(7) Reading the data of page 6, page 10, page 14, . . . and page 58, measuring the mean value of the 10th largest threshold value voltages Vth as the threshold value voltage Vthoe of case C.
(8) Reading the data of page 7, page 11, page 15, . . . and page 59, measuring the mean value of the 10th largest threshold value voltages Vth as the threshold value voltage Vthoo of case D.
(9) Reading the data of page 60, measuring the mean value of the 10th largest threshold value voltages Vth as Vth60.
(10) Reading the data of page 61, measuring the mean value of the 10th largest threshold value voltages Vth as Vth61.
(11) Reading the data of page 62, measuring the mean value of the 10th largest threshold value voltages Vth as Vth62.
(12) Reading the data of page 63, measuring the mean value of the 10th largest threshold value voltages Vth as Vth63.

Next, calculating the offset values based on the threshold value voltages Vth measured in the step S3, letting the calculated offset values to be a part of the mode set data such as erase voltages and stored to the memory register 16 in the step S4, and ending the process. Then, after gathering all of the operation parameters (mode set data) in writing, erasing and reading, writing the data of the memory register 16 to the fuse data storage region of the memory cell array.

Specifically, for example, when the measured data are Vth1=Vth63=0.5 V, Vth0=Vth62=0.6 V, Vth2=Vth3=Vth60=Vth61=1.2 V, Vthee=0.8 V, Vtheo=0.9 V, Vthoe=1.1 V, Vthoo=0.95 V, the offset values can be acquired as Vea=0.6 V, Veb=0.0 V, Vee=0.3 V, Veo=0.1 V, Vec=0.0 V, Ved=0.6 V, if performing erasure by applying those voltages, the threshold value voltages Vth can be equalized after substantially erasing, so that the deviation is suppressed to approximately 0.1 V. (The deviation of the threshold values in FIG. 3 can be eliminated.)

This means that Vth2, Vth3, Vth60, Vth61=1.2 V would be the slowest ones, and the erasure speed of Vthee=0.8 V is 0.4 V faster, so that oppositely applying 0.3 V to voltage Vee to slow down the erasure thereof. The reason that it was not 0.4 V is that, the erasure of the memory cells with the threshold value voltage Vtheo of the same word line will become shallow, so that adapts to this aspect.

Herein, for example, if considering Vth0 and Vth1 on the same word line, the threshold value voltages Vth1 (the word lineWL0, the odd-numbered bit lines and page 1) is 0.1 V deeper after erasure when Vea is set as 0.6 V, but if performing compensation to this, it can be done by merely setting the verify voltage of page 1 as 0.1 V rather than 0 V.

And next, substituting those conditions to perform data erasure, measuring the erase voltage Vep passed the erase verify voltage EV for several blocks, and set the erase starting voltage Vstart as, for example, Vep −4 V. Then, the above mentioned offset values and the erase starting voltage Vstart are stored in the memory register, so that measurement of erasure characteristics and parameters setting are ended.

Herein, the measurement of erasure characteristics is based on a reference of the point of the threshold value Vth of 50% of the bits of page 32 that is 0 V or lower, to measure the threshold values of the bit having 10th-largest threshold voltages of each page, but the present invention is not limited thereto. For example, it can also be based on a reference of the point of 99% of the bits of the fastest page on erasure that is 0 V or lower, or the erase voltages of each page measured as 3n of the bits those are 0 V or lower are applied. In addition, the step voltage is set as 0.2 V, but the following method is also preferable, which is, beginning with 0.5 V at first, and changing to 0.1 V after approaching target value to raise precision.

Figure 8:
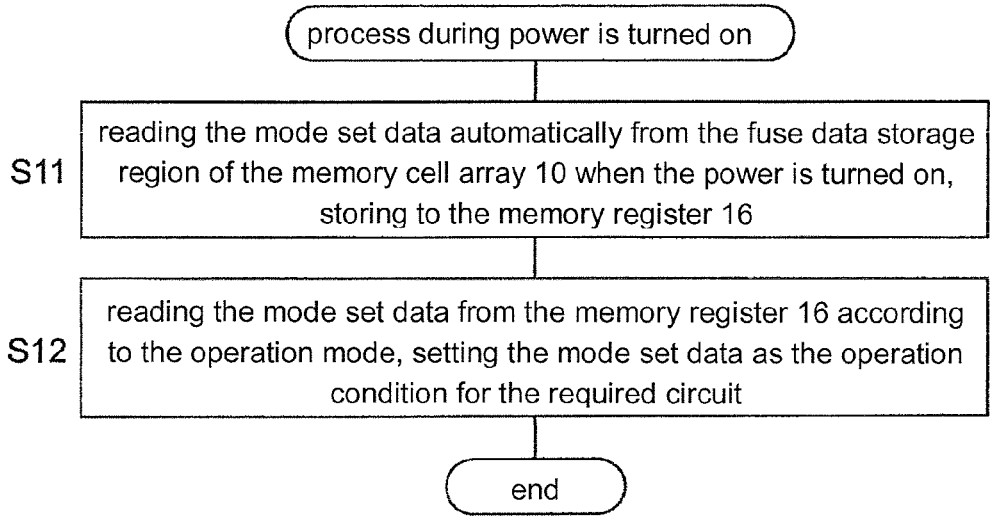

FIG. 8 is a process flow diagram applied when the flash memory of FIG. 4 is turned on. In the step S11 of FIG. 8, the control circuit 11 reads the mode set data from the fuse data storage region of the memory cell array, and transfers to the memory register 16 for storage when it is turned on. Then, in the step S12, reading the mode set data such as erase voltages from the memory register 16, setting the mode set data being read as operation conditions to operate the memory.

As the aforementioned description, according to the present embodiment, applying different word line voltages to erase data on the even-numbered word lines and the odd-numbered word lines, so that performing data erasure can be accorded to the characteristics of the threshold value voltages of data erasure, which can result in erasing data optimistically with high precision compared to the prior art.

Figure 9:
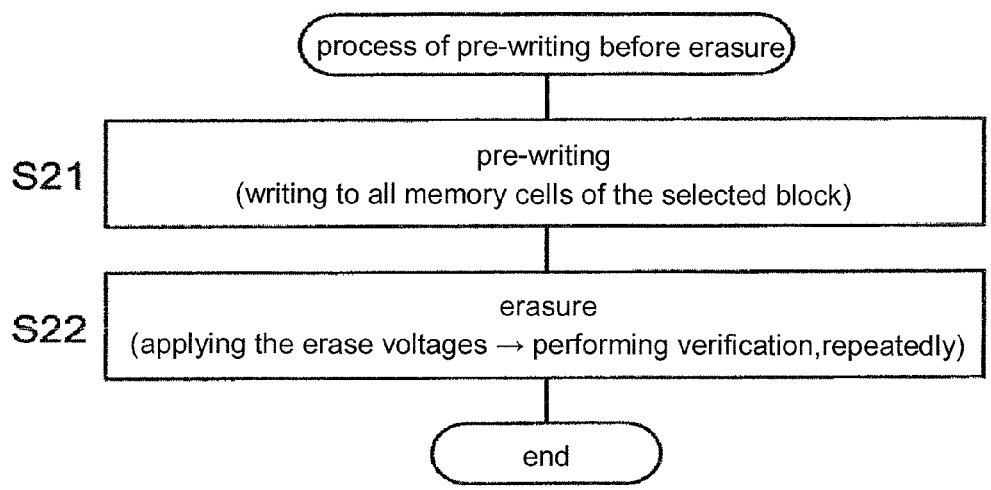
FIG. 9 is a process flow diagram for pre-writing before erasure of the flash memory of FIG. 4.

Herein, conventional erasure is applying erase voltages to the blocks being written with data, which is, applying erase voltages to the memory cells in the state of data 1 of the cells (the state of erasure) and data 0 of the cells (the state of writing) that are both existed in a mixture. In an effect of FN tunneling, even though the threshold values after erasure are not depended on the initial threshold values to be determined, an effect of coupling between floating gates is remained, so it is not ideal. Therefore, the pre-writing process before erasure as shown in FIG. 9, performing writing (S21) before erasure, and applying erase voltages and performing verification (S22) repeatedly. Accordingly, letting the threshold values before applying erase voltages to be approximately consistent, so that the uniformity of the distribution of the threshold values after erasure can be further improved. The writing before erasure does not need a verification and is performed with selecting all of the word lines, so that it can be completed in about 100 microseconds, and erasure is about 2 milli-seconds, thus problems are probably inexistent.

In the aforementioned embodiments, description of NAND type flash memory has been made, but the present invention is not limited thereto. Rather, it can be applied to various non-volatile semiconductor memory devices, such as the NOR type flash memory applied with double patterning technology.

In the aforementioned embodiments, the control circuit 10 performs data erasure by applying predetermined erase voltages to predetermined blocks of the memory cell array, but the present invention is not limited thereto. In various non-volatile semiconductor memory devices such as the NOR type flash memory, it is also possible to perform data erasure by applying predetermined erase voltages to predetermined regions of a memory cell array.

In the aforementioned embodiments, it is also possible to apply voltage to the bit lines under erasure, set the even-numbered bit lines as even-numbered global bit lines, set the odd-numbered bit lines as the odd-numbered global bit lines.

Difference between the present invention and the patent reference 1~patent reference 5.

The present invention is characterized in applying different word line voltages to perform data erasure operation on the even-numbered word lines and the odd-numbered word lines, but the characteristics is not disclosed or implied as well in patent reference 1~patent reference 5.

INDUSTRIAL APPLICABILITY

As the above description in detail, in contrast to the prior art, the present invention can optimize the erasure operation of a non-volatile semiconductor memory device applied with double patterning technology.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A non-volatile semiconductor memory device, comprising a control circuit, the control circuit performing a data erasure by applying predetermined erase voltages to predetermined regions of a memory cell array including memory cells disposed on each intersection of a plurality of word lines and a plurality of bit lines, and the non-volatile semiconductor memory device is characterized by:
the control circuit applying the erase voltages to the memory cells to erase data by applying word line voltages different to each other to even-numbered word lines and odd-numbered word lines of the memory cell array except to an edge part thereof, and by applying a voltage different to the word line voltages to the word lines in the edge part of the memory cell array,
wherein the word lines of the edge part of the memory cell array is at least one word line adjacent to a selection gate line or a dummy word line at both sides,
wherein the control circuit performing a verification of the data erasure in different verify conditions to the memory cells of even-numbered bit lines and the memory cells of odd-numbered bit lines, and
wherein the word line voltages different to each other are determined based on threshold value voltages measured while data erasure in a wafer test of the non-volatile semiconductor memory device.

2. The non-volatile semiconductor memory device of claim 1, wherein the word line voltage applied to the odd-numbered word lines of the memory cell array except to the edge part thereof is set higher or lower than the word line voltage applied to the even-numbered word lines of the memory cell array except to the edge part thereof.

3. The non-volatile semiconductor memory device of claim 1, wherein
the verify conditions to the memory cells of the even-numbered bit lines and the memory cells of the odd-numbered bit lines are set different as at least one of the following conditions:
(1) the word line voltages;
(2) a discharging time of the bit lines those perform pre-charging to the bit lines to read data during data reading;
(3) a charging time of the bit lines when performing charging from a source line to perform data reading during the reverse data reading;
(4) a pre-charging time of the bit lines those perform pre-charging to the bit lines to read data during data reading; and
(5) a sense voltage of the bit lines that perform pre-charging to the bit lines to read data during data reading.

4. The non-volatile semiconductor memory device of claim 1, wherein the word line voltages different to each other are determined based on the erase voltages providing the same threshold value voltage measured while data erasure in the wafer test of the non-volatile semiconductor memory device.

5. The non-volatile semiconductor memory device of claim 1, wherein the threshold value voltages measured while data erasure in the wafer test is measured as the four following cases:
(1) a case of the even-numbered word lines and the even-numbered bit lines;
(2) a case of the even-numbered word lines and the odd-numbered bit lines;
(3) a case of the odd-numbered word lines and the even-numbered bit lines; and
(4) a case of the odd-numbered word lines and the odd-numbered bit lines.

6. The non-volatile semiconductor memory device of claim 1, wherein the erase voltages are applied to wells of the memory cell array.

7. The non-volatile semiconductor memory device of claim 1, wherein the determined word line voltages different to each other are applied during the data erasure when the non-volatile semiconductor memory device is turned on to read from the memory cell array, after storing to a partial region of the memory cell array.

* * * * *